(12) United States Patent
Li et al.

(10) Patent No.: US 7,151,061 B1
(45) Date of Patent: Dec. 19, 2006

(54) METHOD OF SELECTIVE POST-GROWTH TUNING OF AN OPTICAL BANDGAP OF A SEMI-CONDUCTOR HETEROSTRUCTURE AND PRODUCTS PRODUCED THEREOF

(75) Inventors: Gang Li, Singapore (SG); Soo Jin Chua, Singapore (SG)

(73) Assignee: Agency for Science, Technology and Research, Centros (SG)

( * ) Notice: Subject to any disclaimer, the term of this patent is extended or adjusted under 35 U.S.C. 154(b) by 0 days.

(21) Appl. No.: 09/423,401

(22) Filed: Nov. 5, 1999

(30) Foreign Application Priority Data

Nov. 6, 1998  (SG) .................................. 9804027-2

(51) Int. Cl.
*H01L 21/388* (2006.01)
(52) U.S. Cl. ................................ 438/797; 257/E21.086
(58) Field of Classification Search ................. 438/797
See application file for complete search history.

(56) References Cited

U.S. PATENT DOCUMENTS 4,949,352 A * 8/1990 Plumb .................... 372/46.013
5,376,583 A * 12/1994 Northrup et al. ............. 438/23

OTHER PUBLICATIONS

Cohen et al. Applied Physics Letters vol. 73 No. 6 Aug. 10, 1998 "Native defect engineering . . . GaAs". pp. 803-805.*

* cited by examiner

*Primary Examiner*—Jerome Jackson
(74) *Attorney, Agent, or Firm*—Christie, Parker & Hale, LLP.

(57) ABSTRACT

A method of controlling the degree of IFVEI for post-growth tuning of an optical bandgap of a semiconductor heterostructure. The resultant layer structure may contain a semiconductor heterostructure with one or more regions with selectively modified bandgap. According to one aspect of the invention, a metal interlayer is deposited between the heterostructure and a dielectric layer such as silica. According to another aspect of the invention, an oxidized surface is provided between a dielectric layer and the heterostructure. The presence of the oxide layer improves stability and reproducibility in the post-annealing process. In a further aspect, the oxide layer may be provided between the interlayer and the heterostructure. In one embodiment of the invention, a photoresist mask with a specific pattern is deposited on the surface of the heterostructure so that the interlayer is deposited in an unmasked region whereon post-growth tuning results. In another embodiment, multiple photolithography is performed to deposit interlayers of varying thickness and/or regions on the heterostructure, followed by thermal post-annealing of the dielectric layer. This method produces heterostructures with optical bandgaps having selectively tuned regions.

4 Claims, 14 Drawing Sheets

METHOD OF SELECTIVE POST-GROWTH TUNING OF AN OPTICAL BANDGAP OF A SEMI-CONDUCTOR HETEROSTRUCTURE AND PRODUCTS PRODUCED THEREOF

FIELD OF THE INVENTION

The present invention is related to semi-conductor heterostructures with quantum well, multiple quantum well, superlattice or quantum dot structures. In particular, the present invention is related to heterostructures of III–IV compound semiconductors, and the method of selective post-growth tuning of an optical bandgap within the heterostructure.

BACKGROUND OF THE INVENTION

Working wavelength of photonic devices, such as semiconductor lasers and modulators, is determined by an optical bandgap of a semiconductor heterostructure having a quantum well structure, a multiple quantum well structure, a superlattice structure or a quantum dot structure. Other opto-electronic components, such as waveguides and optical interconnects, need to operate at an optical frequency that is non-resonant with the bandgap. To achieve monolithic integration of opto-electronic and photonic devices, one should be able to selectively modify bandgap across a wafer.

Inter-diffusion of atoms in column III or column V or both in the periodic table of elements across a heterojunction of a heterostructure (in short, called as quantum well intermixing, or QW intermixing) has been widely used to post-growth-tune a bandgap. Several methods are well known in the prior art to enhance inter-diffusion.

One method is referred to as impurity-induced QW intermixing and has been demonstrated in a variety of heterostructures by using a diffusion process. See a review article by Marsh, in "Quantum Well Intermixing", Semiconductor Science and Technology, vol. 8, 1993, pp. 1136–1155. This method suffers from several drawbacks. The presence of doping impurities changes conductivity and conductive type, which either deteriorates or completely kills the device performance. Introduction of neutral impurities like F and B by ion-implantation generates traps and residual damages, which also deteriorate the device performance.

The second method is referred to as ion-implantation induced QW intermixing. Ion-implantation generates point defects, such as vacancies in places remote from or over an active region. A method for QW intermixing by implanting ions directly into an active region and then subjecting the structure to thermal annealing suffers from the fact that a high temperature post-annealing may not fully recover from crystal damages caused by ion-implantation and may introduce inhomogeneous QW intermixing. (See Hirayama et al. in "Ion-Species Dependence of Inter-diffusion in Ion-Implanted GaAs-AlAs Superlattices", Japanese Journal of Applied Physics, vol. 24, 1985, pp. 1498–1502). Elman et al. in U.S. Pat. No. 5,238,868 disclosed a method for QW intermixing, in which vacancies and defects generated by ion-implantation are spatially separated from an active region, and in post-annealing, redistribution of those vacancies and defects enhances QW intermixing. This type of methods involves multiple ion-implantation and thermal annealing (see Charbonneau et al. in U.S. Pat. No. 5,395,793). Re-growth is required in some cases where a top ion-implantation damaged region needs to be removed after QW intermixing (See Paquette et al. in "Blueshifting of InGaAsP/InP laser diodes by low energy ion implantation", Applied Physics Letters, vol. 71, 1997, pp. 3749–3751). A large dose of ion-implantation required for a large post-growth tuning often degrades the quality of the heterostructure. (See, Tan et al. in "Wavelength shifting in GaAs quantum well lasers by proton irradiation", in Applied Physics Letters, vol. 71, 1997, pp. 2680–2682).

A third method is commonly referred to as impurity-free vacancy-enhanced intermixing (IFVEI) of QWs. IFVEI has been extensively investigated since its initial report by Deppe et al. in Applied Physics Letters, vol. 49, 1986, pp. 510–512. In IFVEI, a dielectric layer is deposited on the top-surface of the heterostructure. At an elevated post-annealing temperature, atomic vacancies of elements in column III, column V or both in the periodic table of elements, such as Ga, or P vacancies, are generated at an interface between the dielectric layer and the top-surface of the heterostructure. A subsequent diffusion of these vacancies into a heterojunction of the heterostructure enhances inter-diffusion of atoms in column III or column V or both in the periodic table of elements across the heterojunction or in other words, enhances QW intermixing. Comparing the above-mentioned methods, the effect of IFVEI on degradation of electrical and optical properties is minimal, which is especially advantageous if intermixed regions are to be used as an active region or part of an active region in a device. IFVEI usually uses a PECVD (plasma enhanced chemical vapor deposition) deposited or e-beam evaporated $SiO_2$ or spin-on silica as a dielectric layer. The use of a spin-on silica film as a dielectric layer has shown several advantages over the others. IFVEI as a function of annealing conditions has been well described in the prior art, but the difficulty in spatial selection of IFVEI still remains, particularly in the case where more than two different optical bandgaps are needed in close proximity on a wafer.

An approach for spatially selective IFVEI was the use of $SrF_2$ as a layer to inhibit QW intermixing. When the $SrF_2$ coverage varies from 0% to 50%, by varying the space between 1 mm stripes of $SrF_2$, the wavelength shift at 77K varies from 20 nm to 5 nm in a non-linear way after 30s annealing at 925° C. (See Ooi et al. in IEEE Journal of Quantum Electronics, vol. 33, 1997, pp. 1784–1793). This method suffers from a drawback that in order to allow uniform intermixing at a QW depth by overlapping vacancy diffusion fronts, the dimension of $SrF_2$ masks has to be smaller than or comparable to diffusion lengths of point defects. Electron beam lithography is usually employed to generate $SrF_2$ features of sub-micron to one-micron size. Moreover, a $SrF_2$ mask also induces damages and may crack due to thermal stress at an elevated post-growth annealing temperature. The method is difficult to use under manufacturing conditions, and in giving reproducible results.

Cohen et al. (Applied Physics Letters 73:803–805, 1998) described how point defects can be engineered when epitaxial layers covered by a GaAs oxide layer are annealed at a high temperature. This oxide covered quantum wells was found to have interdiffusion of an order of magnitude higher than uncovered layers. When a thin layer of Al was evaporated over the oxide layer prior to rapid thermal annealing, the rate of interdiffusion was found to be reduced by more than an order of magnitude compared to uncovered ones. It was found that QW interdiffusion can be either increased or decreased during high-temperature processing by manipulation of the point defect concentrations.

OBJECT OF THE INVENTION

It is an object of the present invention to provide a simple and effective method for post-growth tuning of an optical bandgap of a semi-conductor heterostructure.

It is another object of the present invention to provide a method for spatially selective post-growth tuning of an optical bandgap of a semi-conductor heterostructure.

It is yet another object of the present invention to provide a layered structure having a semi-conductor heterostructure which has modified bandgaps thereacross.

SUMMARY OF THE INVENTION

The present invention provides a method of controlling the degree of IFVEI for post-growth tuning of an optical bandgap of a semiconductor heterostructure. The resultant layer structure may contain a semi-conductor heterostructure with one or more regions with selectively modified bandgap. According to one aspect of the invention, a metal interlayer is deposited between the heterostructure and a dielectric layer such as silica. According to another aspect of the invention, an oxidized surface is provided between a dielectric layer and the heterostructure. The presence of the oxide layer improves stability and reproducibility in the post-annealing process. In a further aspect, the oxide layer may be provided between the interlayer and the heterostructure. In one embodiment of the invention, a photoresist mask with a specific pattern is deposited on the surface of the heterostructure so that the interlayer is deposited in an unmasked region whereon post-growth tuning results. In another embodiment, multiple photolithography is performed to deposit interlayers of varying thickness and/or regions on the heterostructure, followed by thermal post-annealing of the dielectric layer. This method produces heterostructures with optical bandgaps having selectively tuned regions.

BRIEF DESCRIPTION OF THE DRAWINGS

FIG. 2 is a schematic diagram of a layer structure according to another embodiment of the present invention (FIG. 2a) or prior art (FIG. 2b).

FIG. 3 is a photoluminescence spectrum of three single AlGaAs/GaAs quantum well structure without treatment (FIG. 3A); with HCl etching, silica coating and post annealing (FIG. 3B); and with silica coating followed by post-annealing but without HCl etching (FIG. 3C)

FIG. 10 a–j are steps of a method of making a spatially selective post-growth tuning of an optical bandgap of a semiconductor heterostructure.

DESCRIPTION OF THE INVENTION

The present invention provides a method for post-growth tuning of an optical band-gap of a semiconductor heterostructure of the III-V type, and the layer structure product produced thereof. A heterostructure may be a quantum well structure, a multiple quantum well structure, a superlattice structure, or a quantum dot structure. The present method is based on principle of impurity-free vacancy-enhanced intermixing (IFVEI), and provides useful applications in areas such as spatially selective post-growth tuning of an optical bandgap for the fabrication of a variety of devices, particularly for integration of opto-electronic and photonic devices. One resultant layer structure comprises a metallic interlayer deposited between a semi-conductor heterostructure and a dielectric layer. Another resultant structure comprises an oxide layer provided between the heterostructure and the dielectric layer. In the preferred embodiment, the oxide layer is provided between the interlayer and the heterostructure, followed by the coating of a dielectric layer.

Figure 1A:
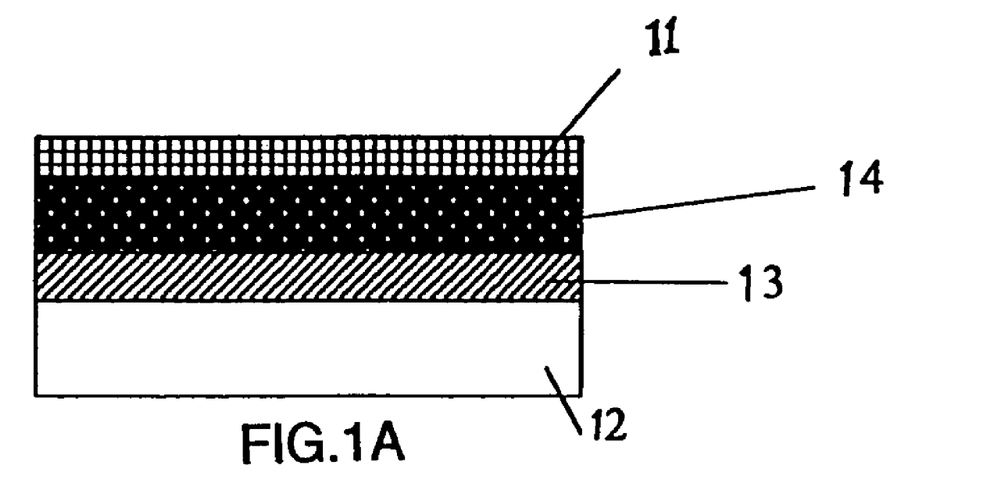
FIGS. 1A and B are schematic diagrams of layer structures according to the present invention.
Figure 1B:
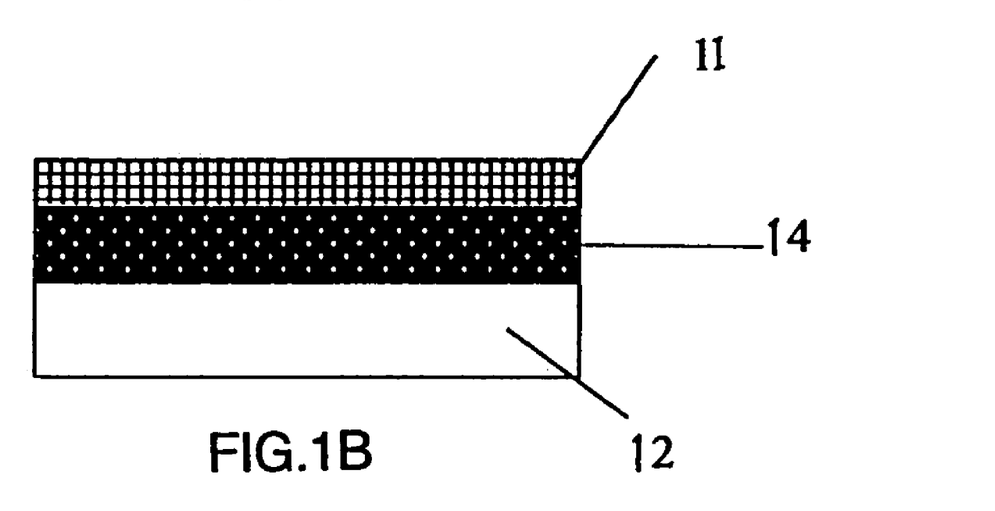

FIG. 1 shows two embodiments of the present invention. A metal interlayer 14 is deposited on an oxide layer 13 on the top surface (FIG. 1A) or a non-oxidized top surface (FIG. 1B) of heterostructure 12, prior to post-annealing coating of a dielectric layer 11.

Figure 2A:
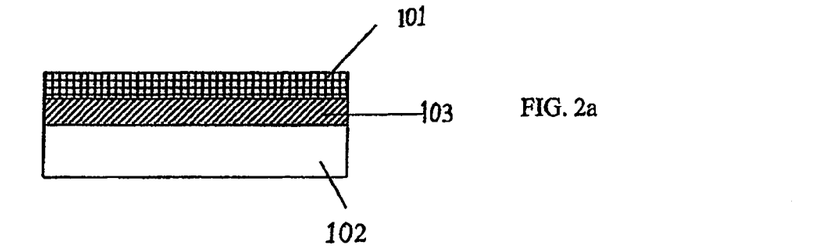
Figure 2B:
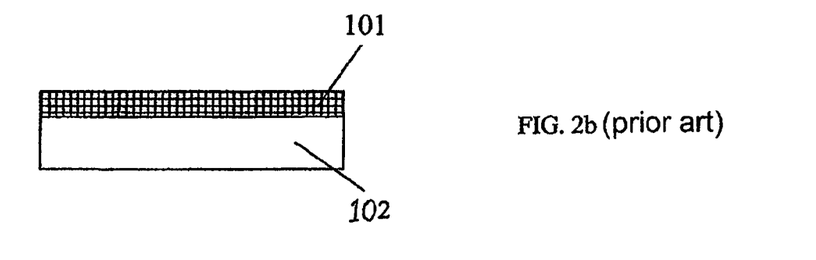

FIG. 2a shows a structure in which an oxide layer 103 is provided between the dielectric layer 101 and the heterostructure 102. FIG. 2b shows a prior art structure in which a dielectric layer 101 is coated onto the surface of a semi-conductor heterostructure 102. Forming an oxide layer on the top surface of the heterostructure before depositing a dielectric layer leads to certain advantages. Comparing with the case where a dielectric layer is directly deposited on an untreated surface for the post-growth tuning process, a proper cleaning followed by oxidation of a processing wafer serves to passivate the top surface of the heterostructure, which prevents undesirable contamination and more importantly makes further processing such as deposition of an interlayer, coating of a dielectric layer, and thermal annealing more reproducible. The oxide layer 103 also prevents thermal decomposition of the heterostructure at an elevated temperature required for post-growth tuning.

Figure 3A:
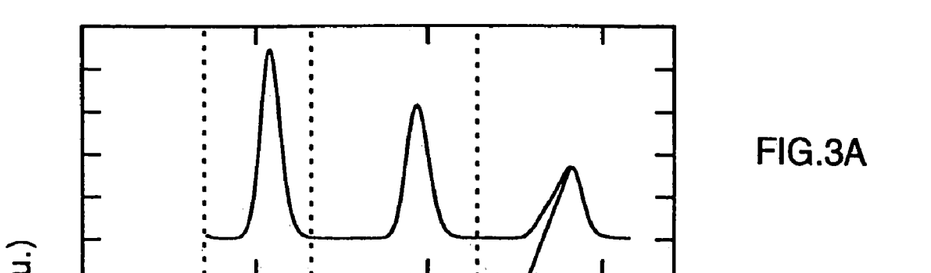
Figure 3B:
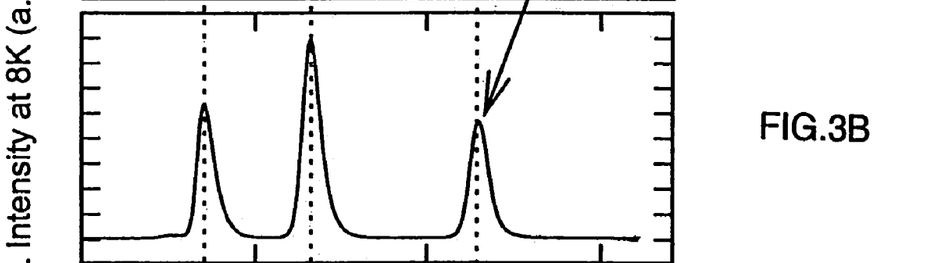
Figure 3C:
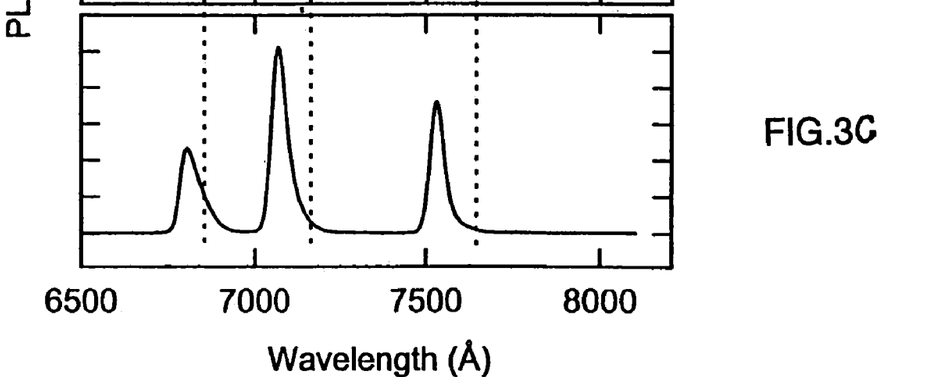
Figure 4A:
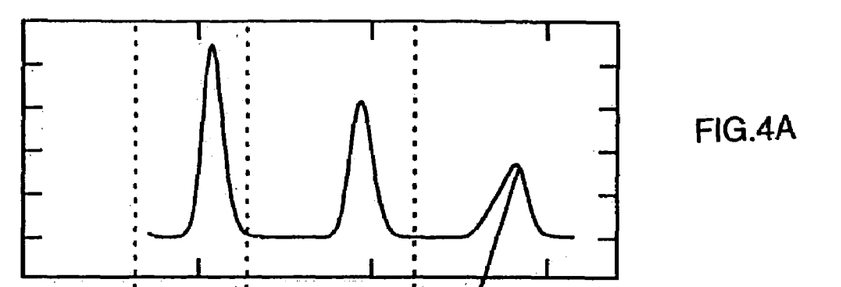
FIGS. 4a–d are photoluminescence spectra of layer structures comprising three single AlGaAs/GaAs quantum well structure after various post-growth tuning processes.
Figure 4B:
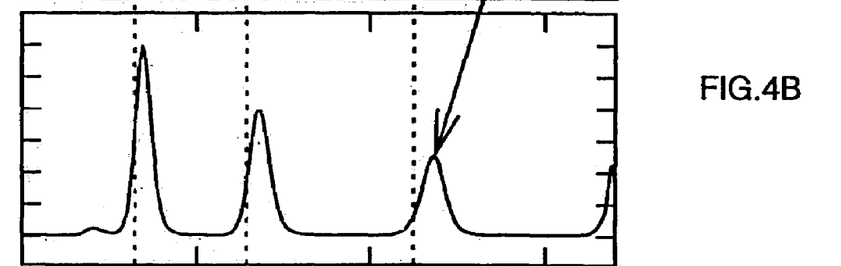
Figure 4C:
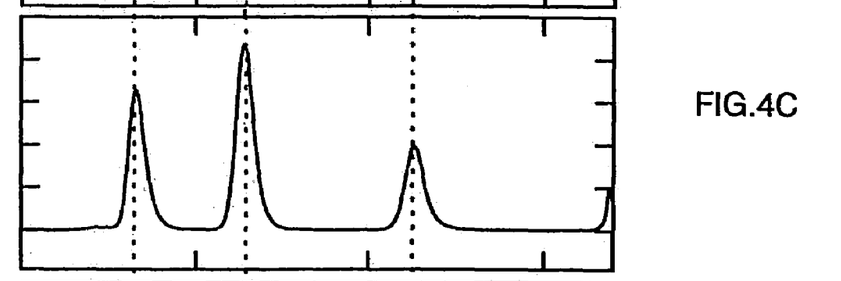
Figure 4D:
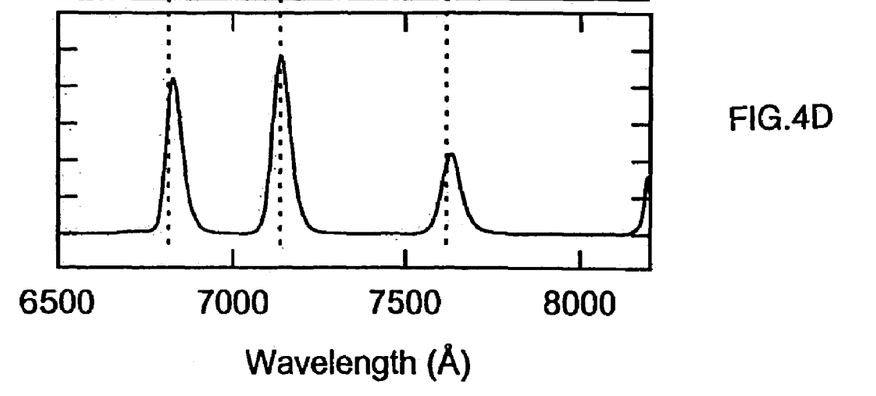
Figure 5A:
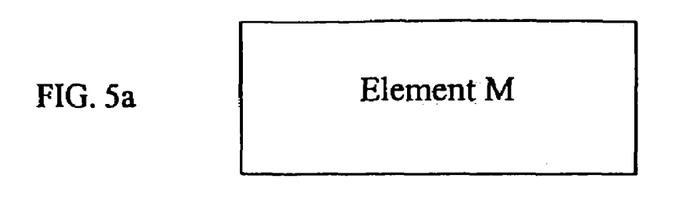
FIGS. 5a–d are interlayer compositions according to various embodiment of the present invention.
Figure 5B:
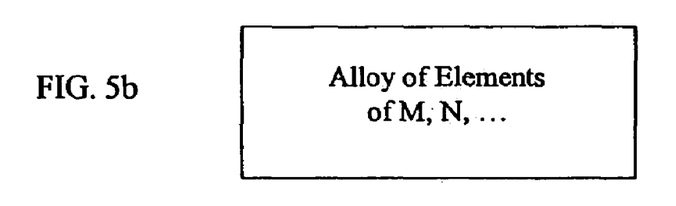
Figure 5C:
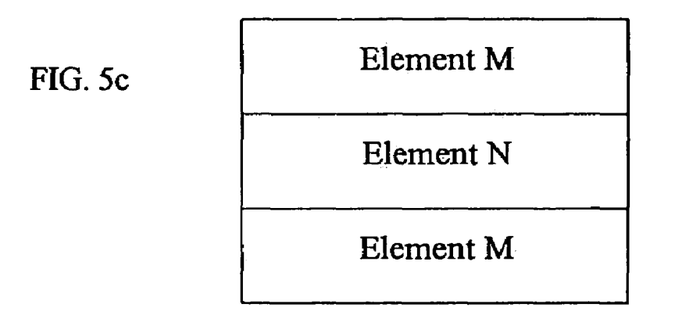
Figure 5D:
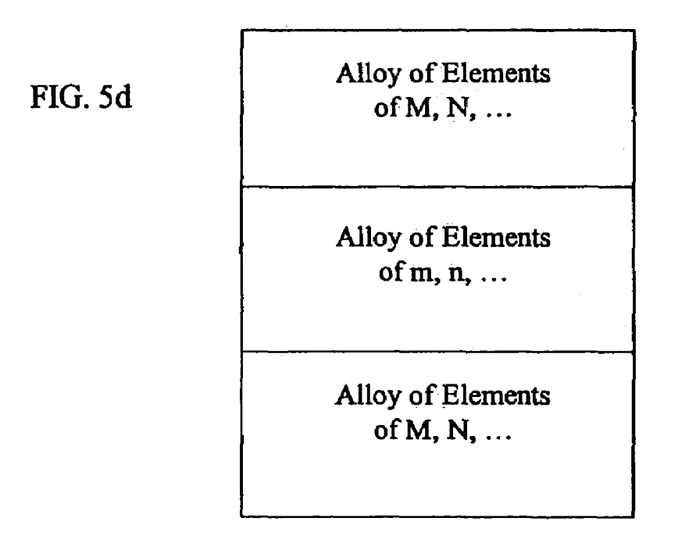

FIGS. 3 and 4 show the difference between the two embodiments, and the effect of the oxide layer on the overall post-growth tuning process. FIG. 3 shows the photoluminescence spectrum of a layer structure comprising three single AlGaAs/GaAs quantum well structure as grown (FIG. 3A) with (FIG. 3B) or without (FIG. 3C) pretreatment of the top surface of the heterostructure by etching with 10% HCl at room temperature before coating with a dielectric layer of silica. Results in FIG. 3 serves to clarify the surface sensitivity of QW intermixing to different treatments. This sensitivity to surface conditions may affect reproducibility of the degree of post-growth tuning. As will be described below, controllability of post-growth tuning is poor if an interlayer is directly deposited on the non-treated surface of a semiconductor heterostructure. Better reproducibility and better controllability of post-growth tuning process can be obtained by coating a dielectric layer and the interlayer on an oxide layer formed on the top-surface of the heterostructure FIG. 4 shows photoluminescence spectra of one layer structure having three single AlGaAs/GaAs quantum well structures after different post-growth tuning process. FIG. 4a shows a spectrum of the as grown heterostructure without oxidation, silica coating or post-growth annealing. FIG. 4b is a spectrum of the layer structure after being subjected to post-growth annealing with a dielectric layer of silica. FIG. 4c is a spectrum of the layer structure after oxidation of the top surface of the heterostructure followed by post-annealing with silica coating. The oxidation was performed in flowing water vapor saturated oxygen gas at 500° C. for 40 minutes. FIG. 4d is the spectrum of the same heterostructure subjected to the same post-growth tuning process as in FIG. 4c except that the oxidation process was performed for 80 minutes. Comparing the spectra after the various treatment, results show that the layer structure which contains an oxide layer 13 may slightly affect the degree of post-growth tuning. However, the thickness of the oxide layer itself does not appear to play a significant role in determining optical and electrical properties of post-growth-tuned heterostructures.

Wet-oxidation of compound semiconductors is a well known process in device fabrication. The oxidation is usually conducted in a layer containing a high Al mole fraction at a temperature of about 450° C. with flowing $N_2$ saturated with water vapor. Under those conditions, however, an oxidation rate for III-V semiconductors containing a low Al mole fraction is very slow.

In accordance with the present invention, an oxide layer 13 can be formed on the top-surface of the heterostructure by thermal oxidation, in the ambient of a flowing water vapor saturated $O_2$ gas or a flowing dry $O_2$ gas or a flowing $H_2O_2$ vapor saturated gas, at a temperature between 300–600° C., preferentially between 400–550° C., or other conventional oxidising conditions. The oxidation occurs even in a compound semiconductor without containing any Al content, such as GaAs. The vapor-saturated gases are obtained by bubbling a carrier gas through $H_2O$ or $H_2O_2$, being maintained at a bath-temperature between 10–100° C. The oxidation reproducibly results in a uniform, stable, continuous film varying in color from light brown to dark brown, depending on its thickness and composition. The thickness and composition of an oxide layer 13 is determined by oxidation temperature and duration, types and flow rates of flowing gases, temperature of $H_2O$ or $H_2O_2$ bath, and composition of the top layer of heterostructure 2.

Post-growth tuning relies on the amount of atomic vacancies of elements in column III or column V or both in the periodic table of elements generated at an interface between a dielectric layer and the top-surface of heterostructure, and consequent diffusion of these vacancies into the structure at an elevated post-growth annealing temperature. A number of parameters such as temperature and duration of post-growth annealing process, properties (thickness, composition, etc.) of a dielectric layer, as well as compositions of compound semiconductor layers making up the heterostructure affect the degree of post-growth tuning.

With reference to FIG. 5, this invention further discloses that interlayer (for example layer 14 of FIG. 1) may comprise a single, multiple elemental or alloyed metal layer structure. FIG. 5a presents a single elemental metal inter-layer structure. FIG. 5b details a single alloyed metal inter-layer structure. FIG. 5c shows a multiple elemental metal inter-layer structure. FIG. 5d gives a multiple alloyed metal inter-layer structure. (M, N . . . m, n, . . . represent different metal elements). These examples are used as illustration only. Other combinations may be determined by one of ordinary skill in the art based on the teachings disclosed herein.

The preferred elements forming the interlayer are those with a very low diffusivity in the heterostructure, those making no doping effect in the heterostructure, and more preferably, those elements forming the heterostructure. For the type of III-V semiconductors, preferred elements may be chosen from columns III and V in the periodic table of elements. More preferably, the interlayer is made of Aluminum for structures with AlGaAs/GaAs quantum wells. The interlayer can be deposited on an oxide layer previously formed on the heterostructure or on a non-oxidized top-surface of the heterostructure using conventional thermal evaporation or e-beam evaporation method. The controllability of the degree of post-growth tuning is implemented by changing parameters such as thickness, structure, and elemental content of the interlayer.

The dielectric layer may be made of any reactive dielectric material which contains basic elements of silicon and oxygen, such as $SiO_2$ or silica, and may be deposited by any deposition method. This layer may also contain other elements such as N and F.

The process in accordance with the present invention is very simple, affordable and flexible, and also compatible with well known semi-conductor processes such as photo-lithography. The use of a photoresist mask and lift-off process allow the spatial selection of the region where post-growth tuning is desired. More importantly, the use of different interlayers may permit one skilled in the art to implement different degrees of post-growth tuning to different desired regions after one post-growth annealing process. This may pave the way to integration of photonic and opto-electronic devices.

An implementation of the present invention is described in more detail below by way of non-limiting example, and with reference to the accompanying drawings.

EXAMPLE 1

Figure 6:
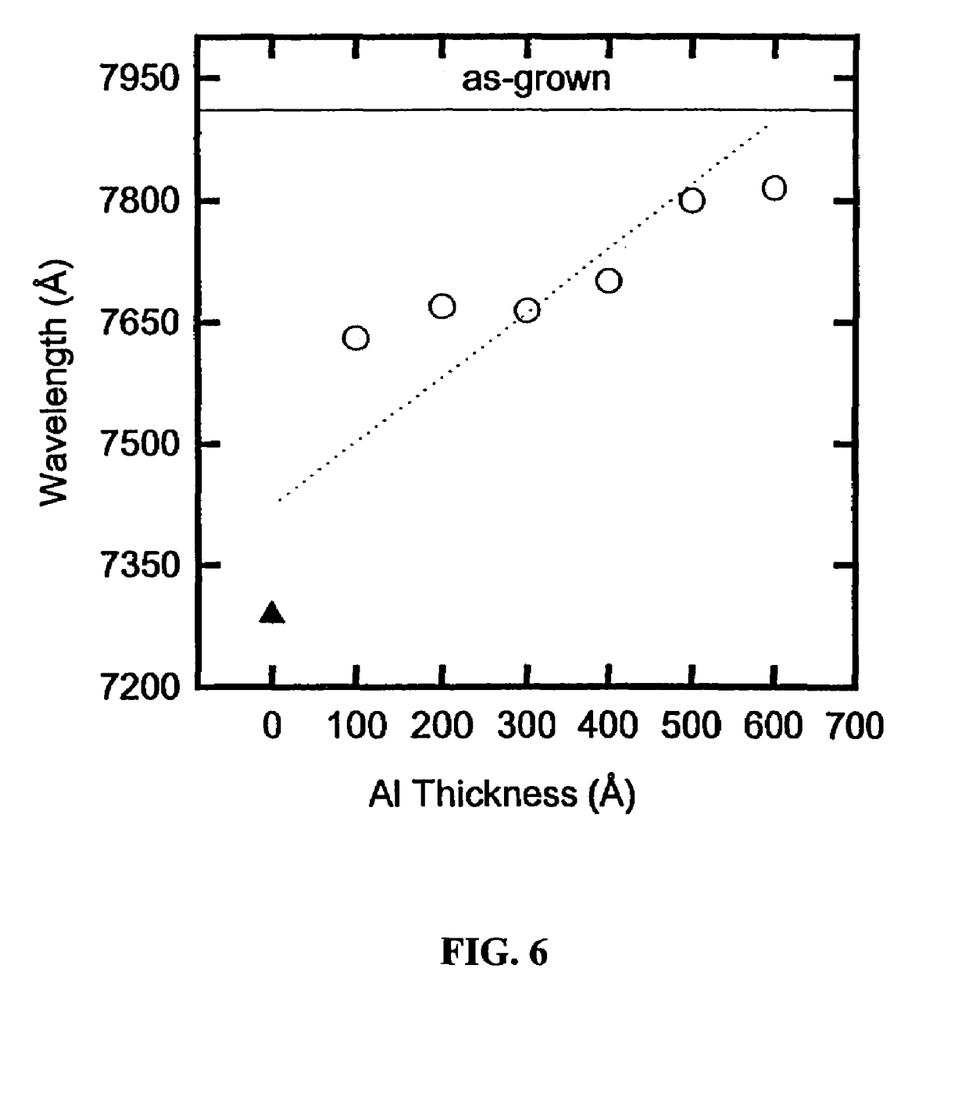
FIG. 6 shows photoluminescence peak wavelengths corresponding to an optical bandgap of a semiconductor heterostructure containing a AlGaAs/GaAs quantum well structure, an Al interlayer and a dielectric layer as a function of the Al interlayer thickness after post-growth tuning.

An AlGaAs/GaAs quantum well heterostructure comprising several alternating AlGaAs and GaAs layers each about tens to hundreds of Angstroms thick was grown on a GaAs substrate. An Al interlayer having thickness varying from 0 Å to 600 Å was evaporated on the top-surface of the heterostructure, coated with a dielectric layer of silica and followed by a thermal annealing at 850° C. for 20 minutes in the forming gas ambience. No oxide layer was provided. As shown in FIG. 6, post-growth tuning was affected by adding an Al interlayer between dielectric layer and heterostructure. The degree of tuning varied according to the thickness of the Al interlayer, but does not display a linear dependence due to the absence of the oxide layer.

EXAMPLE 2

Figure 7:
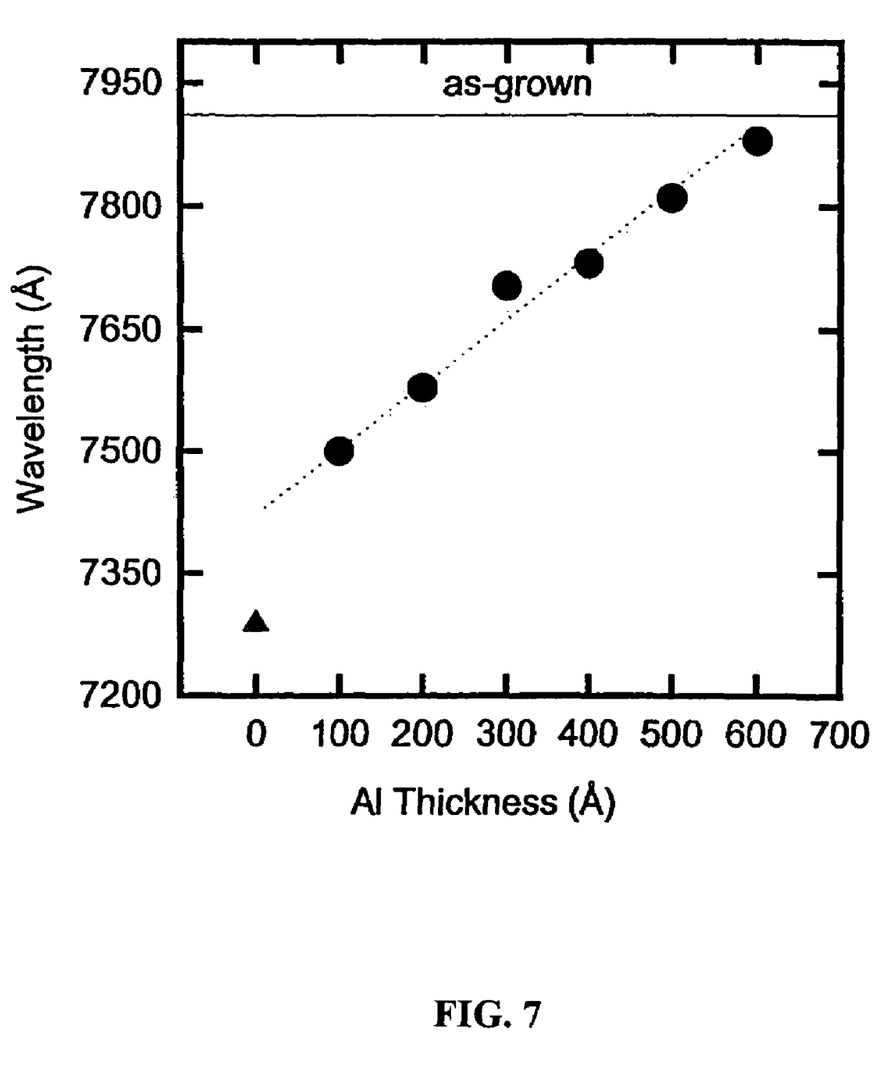
FIG. 7 shows photoluminescence peak wavelengths corresponding to an optical bandgap of a semiconductor heterostructure as in FIG. 6 but with the surface of the heterostructure oxidized.

The same heterostructure as in Example 1 was used, but the Al interlayers were deposited on an oxide layer formed oh the top surface of the heterostructure. The oxide layer was formed by flowing water-saturated oxygen gas over the structure at 500° C. for 40 minutes. The thickness of oxide layer was about 150 Å. As shown in FIG. 7, post-growth tuning depends linearly on the thickness of an Al interlayer. Comparing with FIG. 6, an oxide layer significantly improves reliability of post-growth tuning. Post-growth tuning can therefore be simply and predictably controlled by the thickness of an Al interlayer.

EXAMPLE 3

Figure 8:
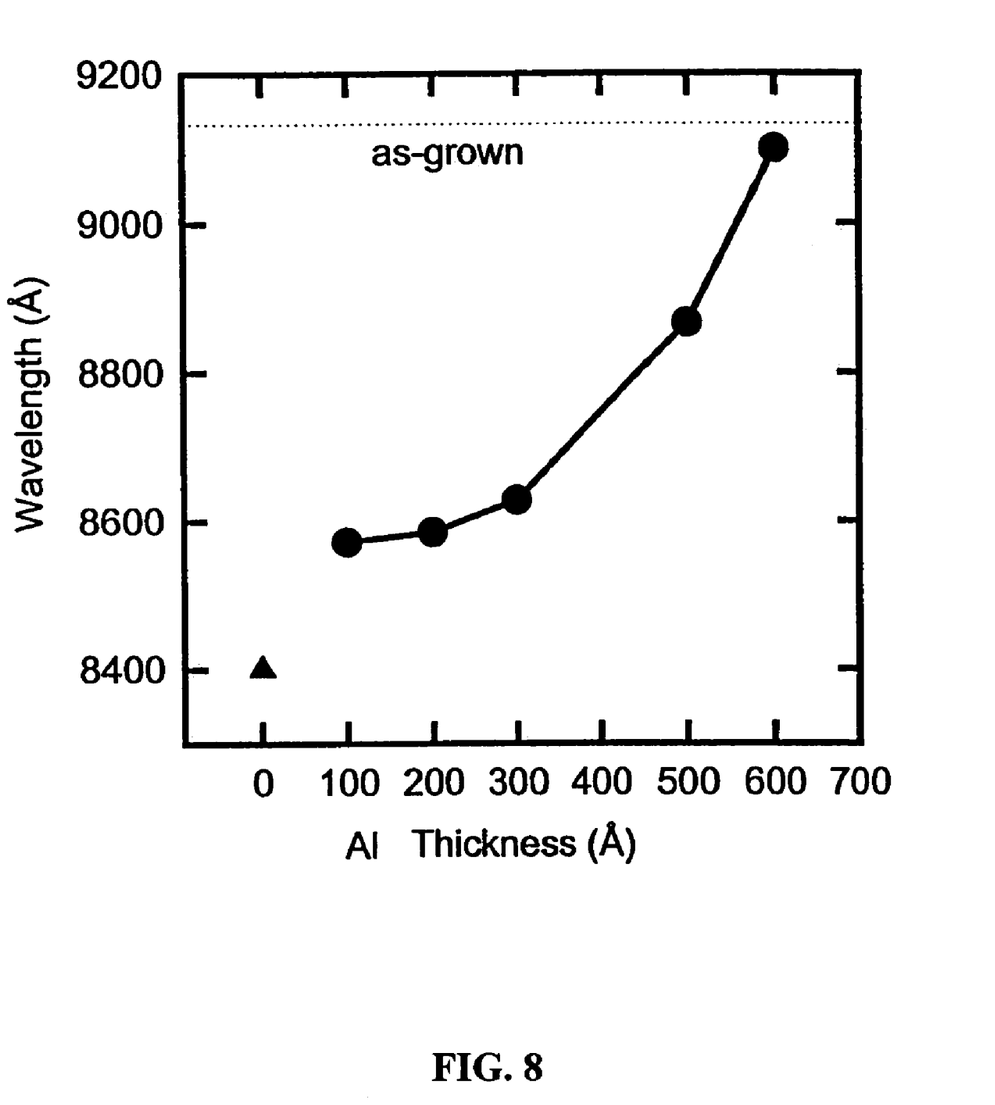
FIG. 8 shows photoluminescence peak wavelengths corresponding to an optical bandgap of a semiconductor heterostructure containing a InGaAs/GaAs quantum well structure, a Al interlayer and a dielectric layer as a function of an Al interlayer thickness after post-growth tuning.

An InGaAs/GaAs quantum well heterostructure comprising several alternating InGaAs and GaAs layers each about tens to hundreds of Angstroms thick was grown on a GaAs substrate. An Al interlayer having thickness varying from 0 Å to 600 Å was evaporated onto an oxide layer formed on the top-surface of the heterostructure, and then coated with a dielectric layer of silica, finally followed by a thermal annealing process. The oxidation and thermal annealing conditions are the same as that of Example 2. The thickness of oxide layer was about 150 Å. The close circles in FIG. 8 show that post-growth tuning in this embodiment depends non-linearly on the thickness of an Al interlayer.

EXAMPLE 4

Figure 9:
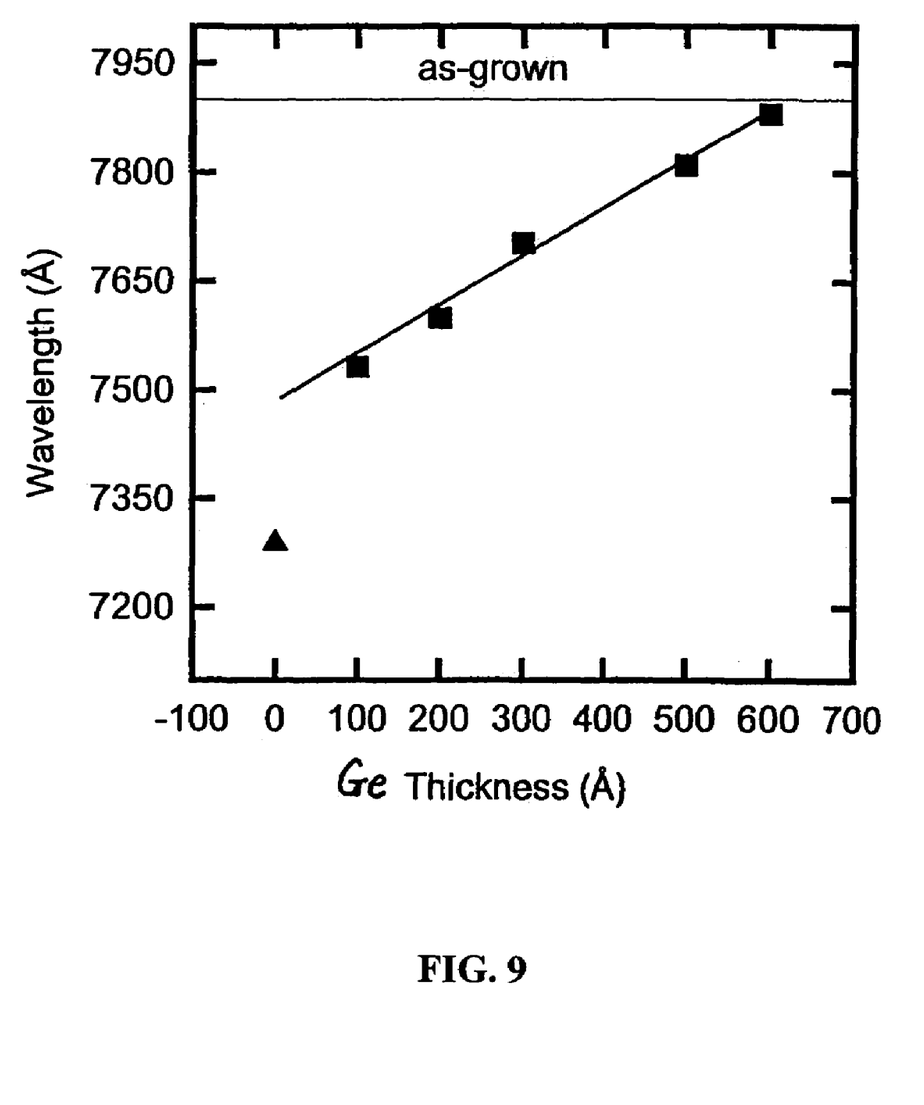
FIG. 9 shows photoluminescence peak wavelengths corresponding to an optical bandgap of the same semiconductor heterostructure as that used for FIG. 8 as a function of a Ge interlayer thickness.

The layer structure used in this example is similar to that in Example 3, except that a Ge interlayer of varying thickness was deposited on the oxide layer instead of Al prior to coating the same silica layer. The Ge interlayer was deposited by e-beam evaporation. As shown in FIG. 9, post-growth tuning under these conditions depends linearly on the thickness of a Ge interlayer. Therefore post-growth tuning can be simply and predictably controlled by the thickness of a Ge interlayer.

EXAMPLE 5

Figure 10A:
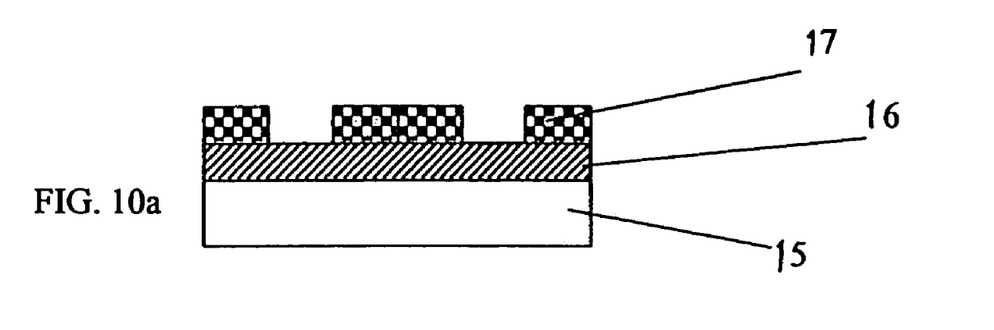

This example shows how photolithography can be conveniently used to produce layer structures with spatially tuned bandgap in the heterostructure. With reference to FIG. 10*a*, a semiconductor heterostructure 15 was first subjected to oxidation according to any of the oxidation methods disclosed above. Oxidation resulted in an oxide layer 16 on the top-surface of the heterostructure 15. A photoresist mask 17 with a specific pattern was laid down on oxide layer 16.

Figure 10B:
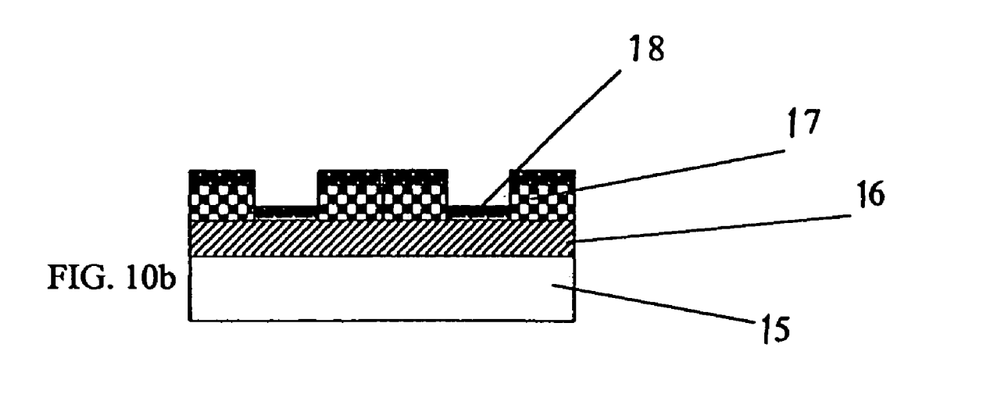
Figure 10C:
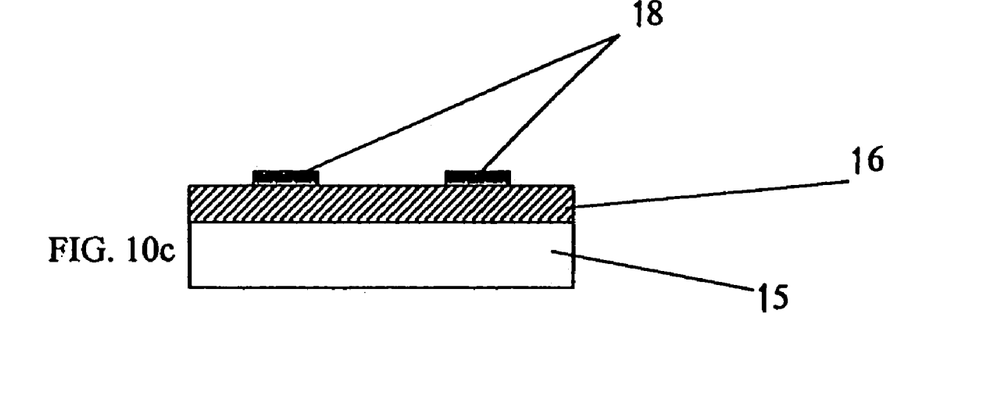

A thin Al interlayer 18 having a uniform thickness of, for example, 100 Å was then evaporated on photoresist mask 17 (see FIG. 10*b*). The photoresist mask was then lift-off by the usual processes, such as in Acetone, leaving a first patterned Al interlayer 18 on oxide layer (see FIG. 10*c*).

Figure 10D:
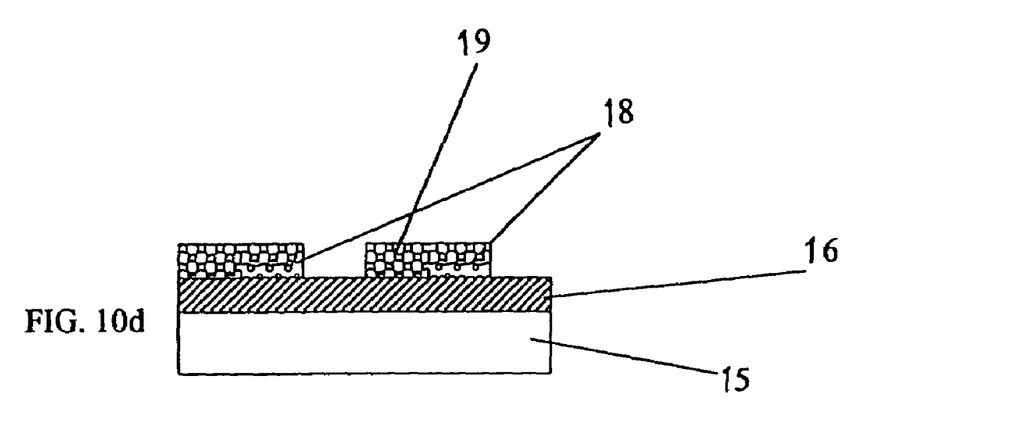
Figure 10E:
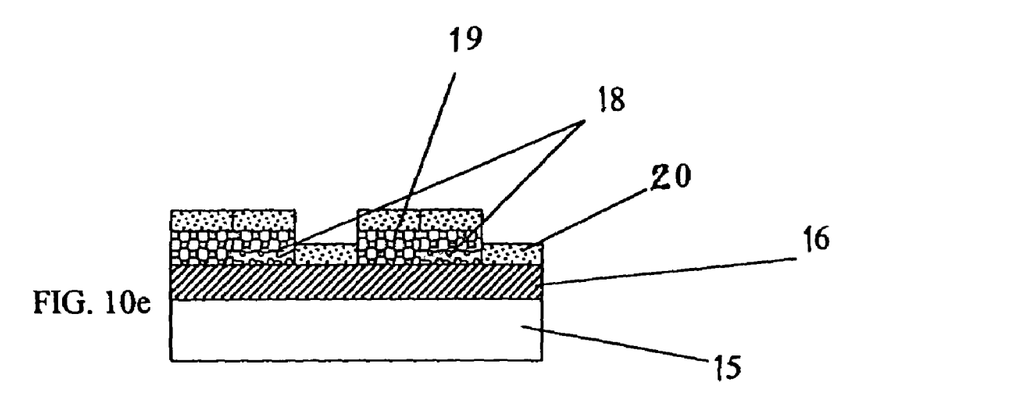
Figure 10F:
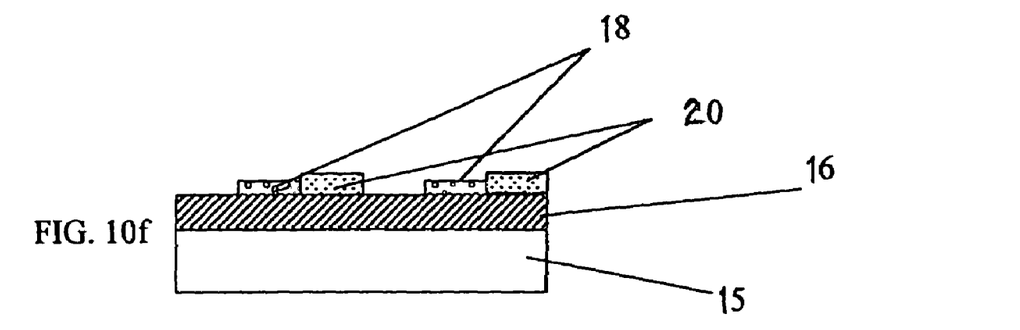

With reference to FIG. 10*d*, a photoresist mask 19 with another specific pattern was laid down on oxide layer 16, and the second Al interlayer 20 having another thickness, for example, 200 Å, was evaporated on photoresist mask 19 (see FIG. 10*e*). The structure was lift-off in Acetone, leaving a second patterned Al interlayer 20 on the oxide layer (see FIG. 10*f*).

Figure 10G:
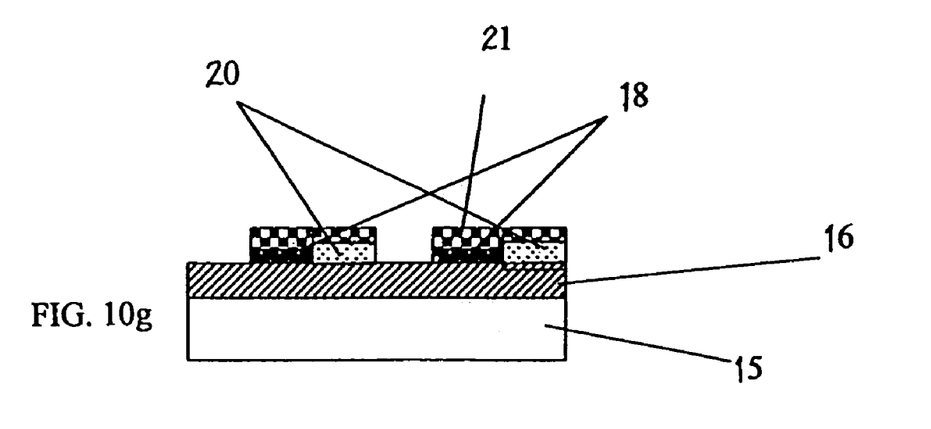
Figure 10H:
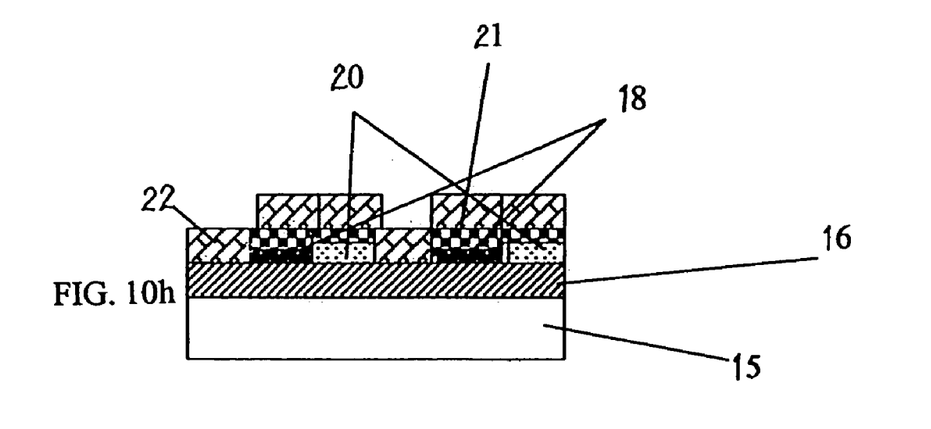
Figure 10I:
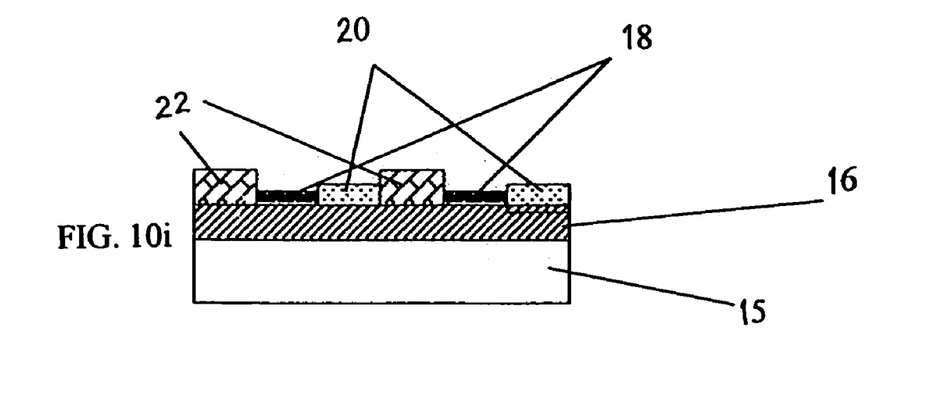
Figure 10J:
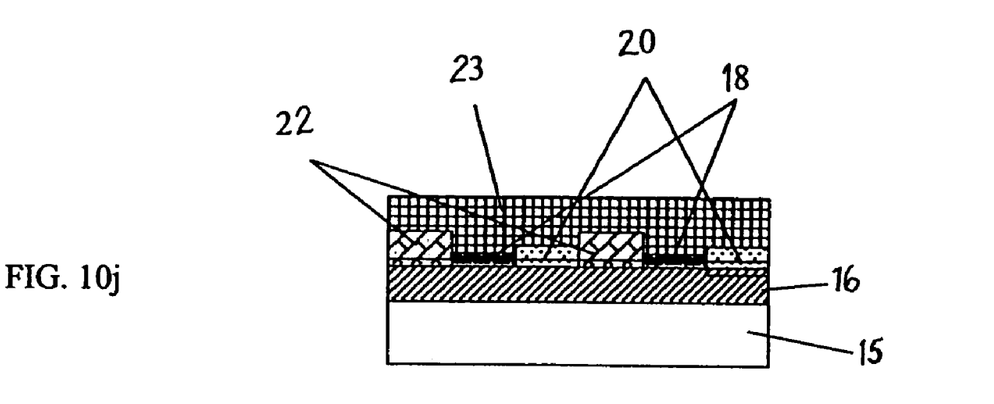

With reference to FIG. 10*g*, a photoresist mask 21 with a further specific pattern was laid down on oxide layer 16. A third Al interlayer 22 having another further thickness, for example 600 Å was evaporated on photoresist mask 21 (see FIG. 10*h*). The structure is lift-off in Acetone, leaving a third patterned Al interlayer 22 on the oxide layer (see FIG. 10l). The layer structure was then coated with a dielectric layer 23 as shown in FIG. 10*j*.

Figure 11:
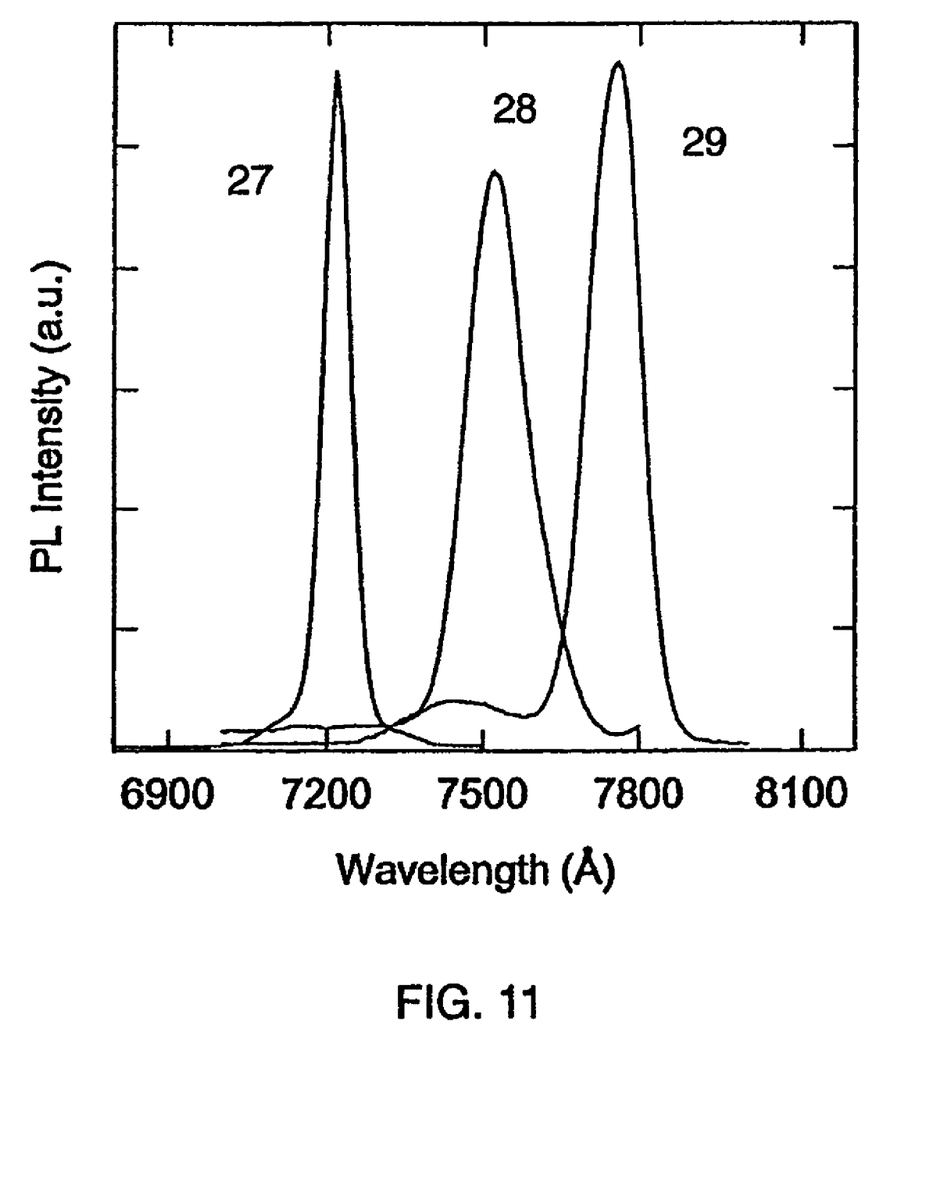
FIG. 11 is a photoluminescence spectrum corresponding to the three selectively tuned regions as shown in FIG. 10.

After being subjected to a thermal annealing process, optical band-gaps of three regions correspondingly having different Al inter-layers are different due to different degrees of post-growth tuning. The photoluminescence spectrum of a layer structure produced using the method described in Example 5 is shown in FIG. 11 Three photoluminescence spectra (Ref. numerals 27, 28 and 29) were obtained from three defined regions having different Al interlayers. The peak wavelengths correspond to optical band-gaps of the heterostructure. This demonstrates spatially selective tuning of an optical band gap across a wafer using the techniques disclosed.

Not limiting to the process described above, it is clear that the use of multiple photoresist masks, followed by the evaporation of different inter-layers allows one skilled to implement many spatially selective post-growth tuning of an optical bandgap of a semiconductor heterostructure in a controlled way based in the teaching disclosed herein. The structure is particularly useful for the fabrication of multiple wavelength laser arrays, and integration of lasers, modulators and other devices to a chip.

While the present invention has been described particularly with references to FIGS. 1 to 11 with emphasis on a post-growth tuning method using an Al or Ge interlayer and photolithography, it should be understood that the figures are for illustration only and should not be taken as limitation on the invention. It is contemplated that many changes and modifications may be made by one of ordinary skill in the art without departing from the spirit and the scope of the invention described.

The invention claimed is:

1. A method of post-growth tuning of an optical bandgap of a semi-conductor heterostructure comprising:
    forming an oxide layer on the top-surface of said heterostructure;
    depositing at least one metallic interlayer on at least one region of said oxide layer;
    depositing a dielectric layer onto said heterostructure; and
    post-annealing said heterostructure.

2. A method according to claim 1 wherein said oxide layer is formed by
    heating said heterostructure in the presence of pure oxygen;
    heating said heterostructure in the presence of oxygen and at least one inert gas;
    heating said heterostructure in the presence of water-saturated pure oxygen;
    heating said heterostructure in the presence of water-saturated oxygen and inert gas;
    heating said heterostructure in the presence of $H_2O_2$-saturated pure oxygen;
    heating said heterostructure in the presence of $H_2O_2$-saturated oxygen and inert gas; or
    heating said heterostructure in the presence of $H_2O_2$-saturated inert gas.

3. A method of post-growth tuning of an optical bandgap of a semi-conductor heterostructure comprising:
    a) forming an oxide layer on the top-surface of said heterostructure;
    b) masking said heterostructure with a mask of a predetermined pattern such that said heterostructure is exposed in unmasked regions;
    c) depositing at least one metallic interlayer on said unmasked regions;
    d) lifting-off said mask;
    e) depositing a dielectric layer onto said heterostructure; and
    f) post-annealing said heterostructure.

4. A method according to claim 3 wherein steps (c) and (d) are repeated to produce additional interlayers according to additional specific patterns.

* * * * *